(12) United States Patent
Onvlee et al.

(10) Patent No.: US 7,679,714 B2
(45) Date of Patent: Mar. 16, 2010

(54) LITHOGRAPHIC APPARATUS, COMBINATION OF LITHOGRAPHIC APPARATUS AND PROCESSING MODULE, AND DEVICE MANUFACTURING METHOD

(75) Inventors: Johannes Onvlee, s-Hertogenbosch (NL); Reinder Teun Plug, Eindhoven (NL); Hubert Marie Segers, 's-Hertogenbosch (NL); David Christopher Christopher Ockwell, Waalre (NL); Paul Jacques Van Wijnen, Veldhoven (NL); Suzan Leonie Auer-Jongepier, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 538 days.

(21) Appl. No.: 11/546,546

(22) Filed: Oct. 12, 2006

(65) Prior Publication Data

US 2008/0145791 A1    Jun. 19, 2008

(51) Int. Cl.
*G03B 27/00* (2006.01)
*G03B 27/42* (2006.01)
*G03B 27/52* (2006.01)

(52) U.S. Cl. .............................. 355/18; 355/53; 355/30

(58) Field of Classification Search ................. 430/311, 430/330; 355/27
See application file for complete search history.

(56) References Cited

U.S. PATENT DOCUMENTS 6,358,672 B2 *    3/2002    Jeoung et al. ................ 430/311
2001/0053500 A1    12/2001    Jeoung et al.

FOREIGN PATENT DOCUMENTS

KR         20060056797 A      5/2006

OTHER PUBLICATIONS

English Translation of Korean Official Action issued on Feb. 12, 2009 in Korean Application No. 10-2007-0102612.

* cited by examiner

*Primary Examiner*—Amanda C. Walke
(74) *Attorney, Agent, or Firm*—Pillsbury Winthrop Shaw Pittman LLP

(57) ABSTRACT

A lithographic apparatus configured to transfer a pattern from a patterning device onto a substrate includes an integrated post-exposure bake device, the post-exposure bake device configured to subject the substrate to a predefined temperature cycle. A post-exposure bake step of the substrate (a temperature cycle) is executed within a predetermined time period after the transfer of the pattern. The lithographic apparatus may be combined with a processing system having one or more processing modules. More efficient use may be made of the combination, allowing flexibility for a device manufacturing method.

12 Claims, 4 Drawing Sheets

LITHOGRAPHIC APPARATUS, COMBINATION OF LITHOGRAPHIC APPARATUS AND PROCESSING MODULE, AND DEVICE MANUFACTURING METHOD

FIELD

The invention relates to a lithographic apparatus, a combination of a lithographic apparatus and a processing system and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a chip production facility, or a substrate processing facility, a lithographic apparatus is usually directly connected to a track module. At least one of the processing steps performed by the track module, i.e. the post-exposure bake step, can be time critical. Variation in time between the exposure and the bake of a substrate may then result in variations in obtainable critical dimension (CD). Furthermore, the reliability of the (single) track module or scanner module partly determines the reliability of the entire substrate processing facility (when a module is down, the entire production line is typically down). A track module is in general controlled using a fixed frequency, whereas a lithographic apparatus is more event driven (one exposure step possibly takes much longer than another exposure step for the same substrate).

An inline cluster of a track module and a lithographic apparatus may be created, which eliminates two intermediate transport steps between the track module and the lithographic apparatus. Such a cluster can process substrate layers that require a single or two (or more) consecutive lithographic exposure steps ("double exposure"). A potential problem of such a cluster is that the performance of this linked cluster may be determined by the slowest component in the cluster. The handling complexity in the track module that combines both the coat (i.e., substrate input path) as well as the post exposure bake (PEB) and develop (i.e., substrate output path) processes can result in a situation where the slowest of these steps determines the throughput of the other steps. Therefore, as a result of speed differences and different control strategies, the combination of track module and lithographic apparatus may not always be used at maximum efficiency.

SUMMARY

It is desirable, for example, to obtain a higher efficiency of the substrate processing facility, while still maintaining optimum performance with respect to obtainable parameters, such as critical dimension (CD) or overlay (OV).

According to an aspect of the invention, there is provided a lithographic apparatus configured to transfer a pattern from a patterning device onto a substrate, comprising an integrated post-exposure bake device, the post-exposure bake device configured to subject the substrate to a predefined temperature cycle.

According to an aspect of the invention, there is provided a combination of a lithographic apparatus configured to transfer a pattern from a patterning device onto a substrate and a processing system, wherein the lithographic apparatus comprises an integrated post-exposure bake device, the post-exposure bake device configured to subject the substrate to a predefined temperature cycle, and wherein the processing system comprises a substrate interface configured to provide a substrate to the lithographic apparatus and to receive a substrate from the lithographic apparatus.

According to an aspect of the invention, there is provided A device manufacturing method, comprising:

transferring a pattern from a patterning device onto a substrate subjecting the substrate to a predefined temperature cycle after transferring of the pattern;

pre-processing of the substrate before transferring the pattern; and post-processing of the substrate after transferring the pattern, wherein the transferring of the pattern and the subjecting the substrate to a predefined temperature cycle of the substrate are executed within a lithographic apparatus; and the pre-processing and post-processing are executed independently from the transferring of the pattern and the subjecting the substrate to a predefined temperature cycle.

Independent execution may e.g. comprise asynchronous execution of the respective operations.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
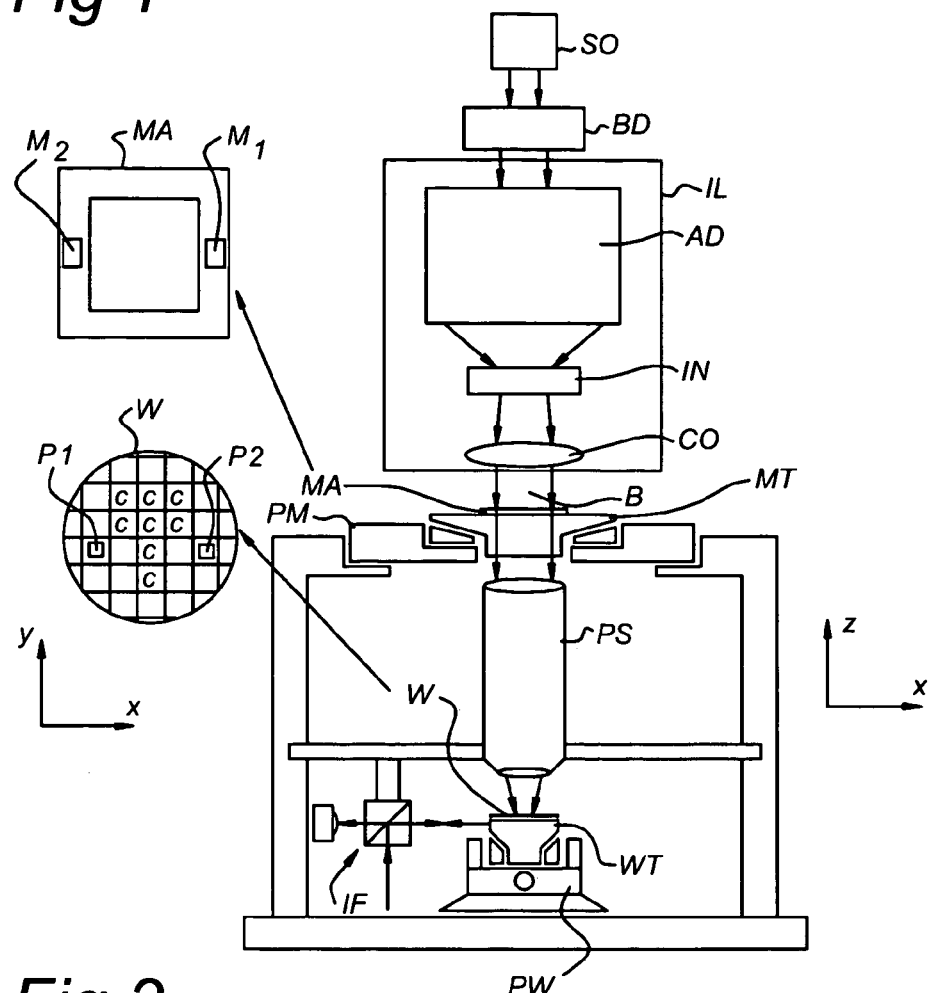
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation, DUV or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Processing of substrates in a processing facility may comprise simple consecutive steps (e.g. coat, expose, post-exposure bake, develop, etch, inspect) which may be repeated several times. More complicated processing is also applied, e.g. in the case of double exposure processing. In such a case, the substrate is subjected to the consecutive processing steps of coat, expose, second expose, post-exposure bake, and develop.

Figure 2:
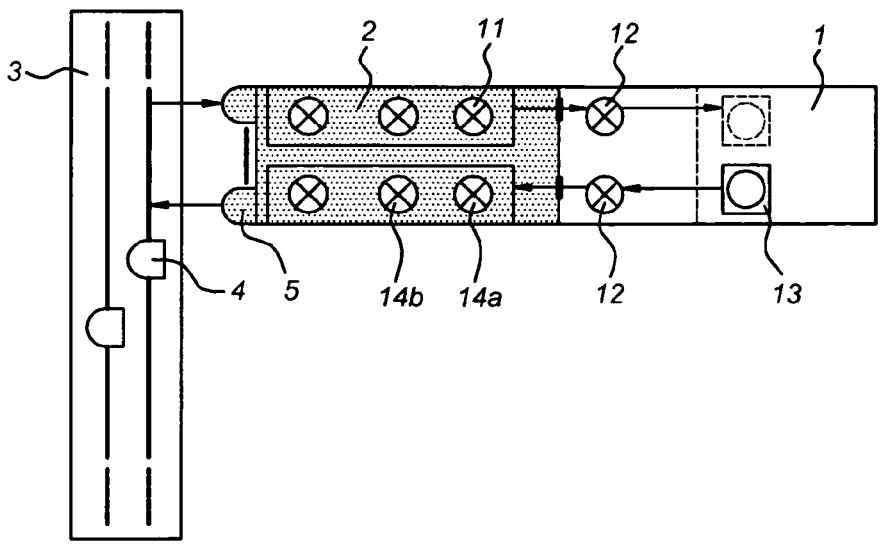
FIG. 2 shows a schematic view of a substrate processing facility.

In FIG. 2, a typical set up of a substrate processing facility is shown schematically, which comprises the lithographic apparatus 1, a processing module 2, and an optional transport system 3. The processing module (e.g. a track module) 2 is coupled tightly to the lithographic apparatus 1, e.g. using a gas tight seal. Substrates W are transported in open or closed off containers 4, e.g. an open carrier or a Front Opening Unified Pod (FOUP), which in general comprise a large number of substrates W. The contents of a number of containers 4 may form a lot of substrates, which are all intended to undergo the same processing steps in the substrate processing facility, or one or a number of lots requiring different processing steps may be present in a single container 4. The transport system 3 moves the containers 4 from and to an indexer 5, which couples the container 4 to the processing module 2. The (single) processing module 2 is arranged to perform pre-expose processing steps such as coat and soft-bake on a substrate (indicated by reference numeral 11) before it is further transported to the lithographic apparatus 1. Note that the layout of the various units in the processing module 2 are schematic only. The lithographic apparatus 1 receives the substrate, handles and prepares the substrate, e.g. pre-alignment, temperature stabilization (reference numeral 12), and performs the actual exposure of the substrate (reference numeral 13). After exposure, the substrate is transported back to the processing module 2, in which the substrate undergoes post-exposure processing steps, such as a post-exposure bake/chill step (reference numeral 14a), and a developing step (reference numeral 14b). After that, the indexer 5 returns the substrate to the correct container 4.

The lithographic apparatus 1 is directly connected to the processing module 2. At least one of the processing steps performed by the processing module 2, i.e. the post-exposure bake step, is time critical. Variation in time between the exposure and the bake of a substrate can result in variations in obtainable critical dimension (CD).

Furthermore, the reliability of the (single) processing module 2 and/or the lithographic apparatus 1 partly determines the reliability of the entire substrate processing facility (when the processing module 2 is down, the entire production line may be down). A processing module 2 is in general controlled using a fixed frequency, whereas a lithographic apparatus 1 is mostly event driven (one exposure step possibly takes much longer than another exposure step for the same substrate). Also the slowest part of the combination determines the throughput. Therefore, the combination of processing module 2 and lithographic apparatus 1 may not always be used at maximum efficiency.

According to an embodiment of the invention, the processing system is split into a plurality of processing or track modules 2, in which each processing module 2 has a reduced functionality, a reduced complexity, or both. Apart from a track module, other process modules can be added such as etch, inspect, etc. For example, a processing system (processing module 2 of FIG. 2) may be arranged to perform a number of functions, including but not limited to providing a coating to the substrate, developing the substrate, buffer the substrate, and/or perform measurements on the substrate. Each of the processing modules 2 of an embodiment of the invention may be configured to execute a subset of these functions, independently from the other components of the substrate processing facility. This independence may, for example, be implemented such that the various operations of the substrate processing facility are executed asynchronously. This will increase the reliability and/or productivity of each of the parts of the production line, and hence of the entire production line. Various embodiments of the invention, which will be described in more detail below, will allow for reduction of the tight coupling between (some of the) processing modules 2 and the lithographic apparatus 1, and to increase the flexibility for a user of a production line to tune the performance of individual parts of the production line.

In the embodiments described below, it is possible to maintain a constant timing between the exposure step in the lithographic apparatus 1 and the post-exposure bake step, to allow or maintain an optimized CD for a substrate lot. In this respect, two parameters may be subject to constant timing, i.e. the absolute duration of the various steps, and the variation of such duration within a lot. This may be accomplished by keeping the post-exposure bake step interconnected to the lithographic apparatus 1, e.g. by integrating the PEB step in the lithographic apparatus 1, and transporting the substrate only after this step. The PEB step may be integrated in the lithographic apparatus 1 using a post-exposure bake device 23, which is configured to execute the PEB step. The PEB step comprises subjecting the substrate W to a predetermined temperature cycle, e.g. heating the substrate W to a first temperature within a first time period, maintaining the first temperature for a second time period, and then cooling (chilling) the substrate W to a second, lower temperature within a third time period.

Figure 3:
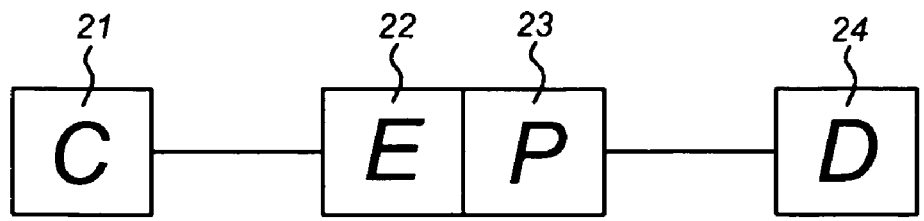
FIG. 3 shows a simplified schematic view of a substrate processing facility according to a first embodiment of the invention.

In FIG. 3, a first embodiment of the invention is shown as schematic blocks representing major processing steps or devices in a substrate processing cycle. Block 21 represents the coating step of a substrate or a coating device, block 22 represents an actual exposure step of a substrate or a substrate stage for exposure, block 23 represents a post-exposure bake step of a substrate or a post-exposure bake device, and block 24 represents a developing step of the substrate or a developing device. The coating step is understood to comprise all related processes, such as bake, chill, etc. as required to prepare the substrate for exposure. In an analogue manner, the developing step is understood to comprise related processes to prepare the substrate for further processing (e.g. rinsing of the substrate). As indicated in FIG. 3, the exposure step 22 and post-exposure bake step 23 are tightly coupled, while the coating step 21 and developing step 24 are more loosely coupled in the system. For example, in a combination of a lithographic apparatus 1 and a track module, the track module may comprise a plurality of processing modules 2. The lithographic apparatus 1 performing the exposure step 22 also performs the post exposure bake step, e.g. using a post-exposure bake device 23, while further processing modules 2 which perform the coating step 21 and the developing step 24 are coupled to the lithographic apparatus 1, as indicated by the lines.

In a practical implementation, this may be accomplished by integrating a post-exposure step in the lithographic apparatus 1 itself. The substrates may be transported between the further processing modules 2 and the lithographic apparatus 1 in a conventional manner, e.g. using a container 4 to transport a plurality of substrates.

Integration of the post-exposure bake step or post-exposure bake device 23 with the lithography apparatus (tight coupling of blocks 22 and 23 in FIG. 3) will create great flexibility. By integrating the control of the lithographic process and the post-exposure bake device, timing variations may be minimized. Also, in such a configuration, the distance between the lithographic process steps (block 22) and the post-exposure bake steps (block 23) is smallest, both physically, as well as "in time".

Figure 4:
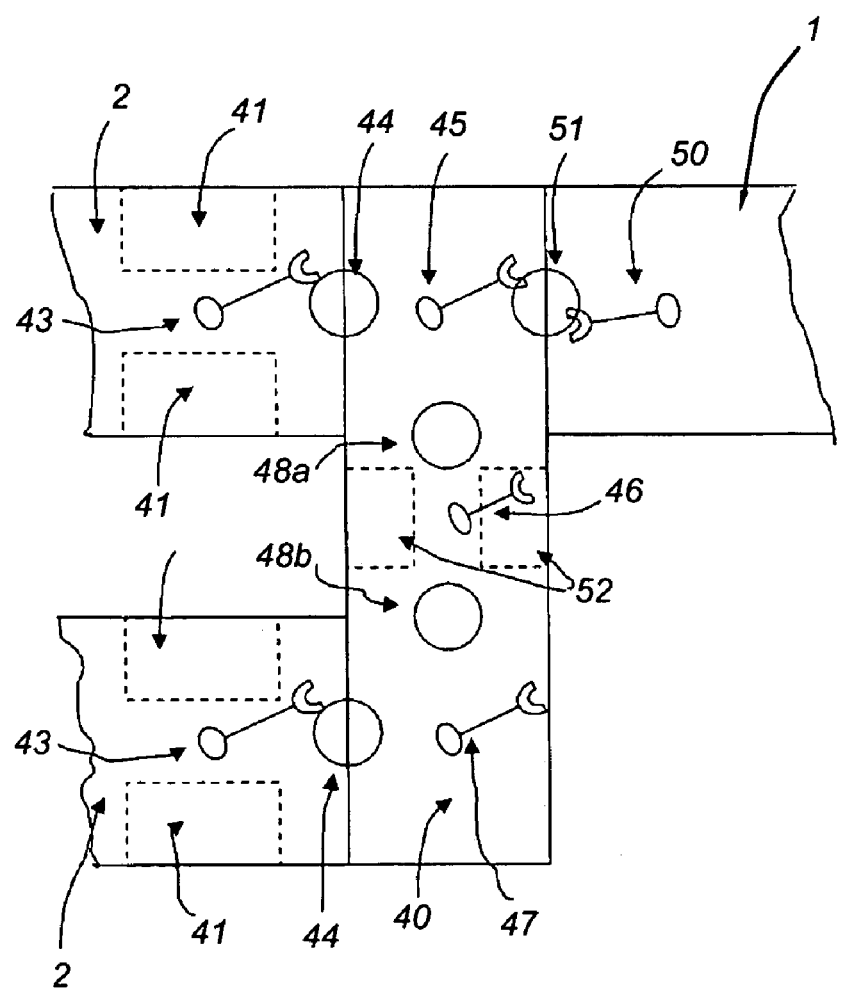
FIG. 4 shows a simplified schematic view of a substrate processing facility according to a second embodiment of the invention.

The tight coupling in an embodiment of the invention may be achieved using an interface unit 40, an embodiment of which is shown in FIG. 4.

Two processing modules 2 are connected to the interface unit 40 (shown on the left side of FIG. 4). Each processing module 2 may contain various processing stations 41 that can be accessed by one or more track module robots 43. In order to receive or send substrates to other units, the track module robot 43 puts substrates on a buffer/transfer location 44 or picks up substrates from that location. The interface unit 40 comprises one or multiple robots 45, 46, 47 to transfer a substrate between the different stations. It is clear that these robots can be of various types, for instance with a single gripper containing one substrate at a time or with multiple grippers. These robots 45, 46, 47 can move substrates to and from respective interface positions 48a, 48b. For instance the robot 45 can transfer substrates between the upper processing module 2 and the lithographic apparatus 1, moving substrates between buffer positions 44 and 51. The lithographic apparatus 1 contains an internal substrate handling robot 50 which can put a substrate to or pick up a substrate from an interface buffer position 51. To move substrates inside the interface unit 40, one or more intermediate robots 46 can be used. FIG. 4 shows an example with one such intermediate robot 46. This intermediate robot 46 can also move substrates to interface process stations 52, which can contain various types of functionality, for instance additional buffers or metrology. The above is just an embodiment of the interface unit 40. An interface unit having more or less robots, interface positions, buffer positions and interface units for FOUPS may be provided.

In order to improve or maximize the efficiency of a substrate processing facility, the production line should be arranged in such a manner that the most expensive part of the production facility is used at its maximum capacity, and at a usage rate as high as possible. This may be achieved, for example, by using a larger number of processing modules 2 which perform the same functions, and which have, seen as stand alone units, a higher throughput capacity than the lithographic apparatus 1. Thus, in an embodiment of the invention, the at least two processing modules 2 have a combined throughput capacity which is larger than the throughput capacity of the lithographic apparatus 1. In this manner, the high value expose step 13 and post-exposure bake step 14 may be utilized at maximum efficiency. Also, the substrate processing facility as a whole will be more robust, as a failure of one of the lower value processing modules 2, which are present in multiple numbers, will not shut down the production line completely.

Figure 5:
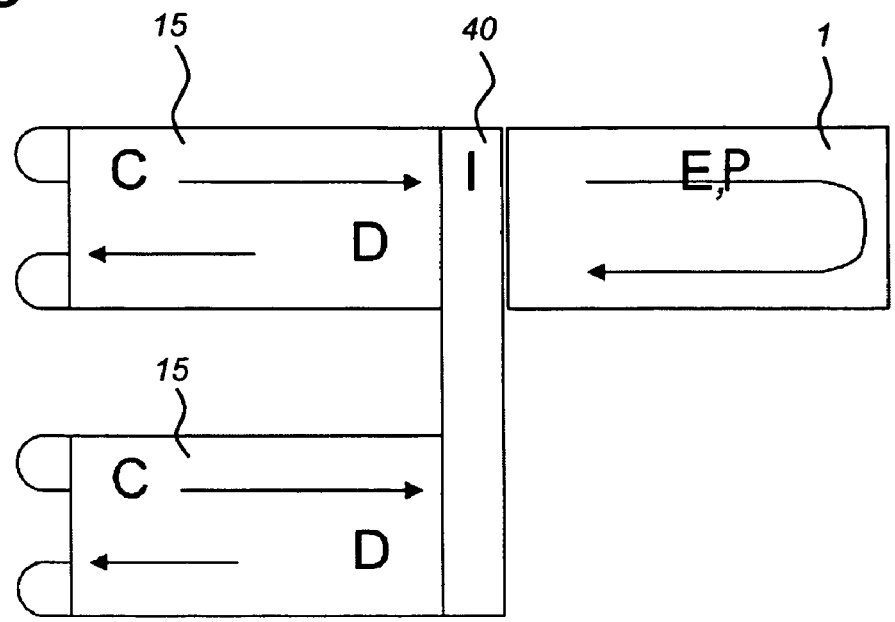
FIG. 5 shows a simplified schematic view of a substrate processing facility according to a third embodiment of the invention.

A first embodiment thereof is schematically shown in FIG. 5. In this embodiment, a single lithographic apparatus 1 is coupled to two track modules 15, wherein each track module 15 is arranged to perform the coating step 21 and the developing step 24. The total capacity (or throughput rate) of the combined track modules 15 is larger than the capacity of the lithographic apparatus 1, which is also arranged to execute the post-exposure bake step 23 (E,P). The lithographic apparatus 1 is configured to allow reception of substrates and delivery of substrates from/to each of the track modules 15, e.g. by using the interface unit 40. By properly controlling the flow of substrates in the combination of lithographic apparatus 1 and processing modules 2, bottle necks caused by a lot of substrates which require longer processing times than another lot of substrates, may be prevented. Additional buffering capacity may be added in the interface unit 40, e.g. at the positions indicated by reference numeral 52 in FIG. 4. Also at positions between buffer positions 44 and 51, additional buffers may be used (not shown in the Figure). The interface positions 48a and 48b are buffer positions that hold at least one substrate, to interface the respective various robots 45, 46 and 47. All (additional) buffers may be used to collect substrates of a slow lot during processing of another lot using the other processing module 2. For example, a lot of substrates requiring long processing may be handled by the upper processing module 2 in FIG. 5, while a lot of substrates requiring shorter processing times may be handled by the lower processing module 2 in FIG. 5. This allows operation of the upper processing module 2 at a lower handling rate than the lower processing module 2, while still maintaining a maximum efficiency of the lithographic apparatus 1. When only a single processing module 2 would be present (see the embodiment of FIG. 2), the slower lot of substrates would dictate a slower overall processing speed. Thus, in a further embodiment, one of the at least two processing modules comprises a combination of a coating stage and a developing stage, the combination being configured to receive a substrate (e.g. from a container 4), to coat the substrate, to transfer the substrate to the lithographic apparatus 1, to receive a substrate from the lithographic apparatus 1, to develop the substrate, and to transfer the substrate (again, e.g., using a container 4).

In the embodiment shown in FIG. 5, the post-exposure bake step is part of the lithographic apparatus 1 (after the exposure), as discussed above.

Figure 6:
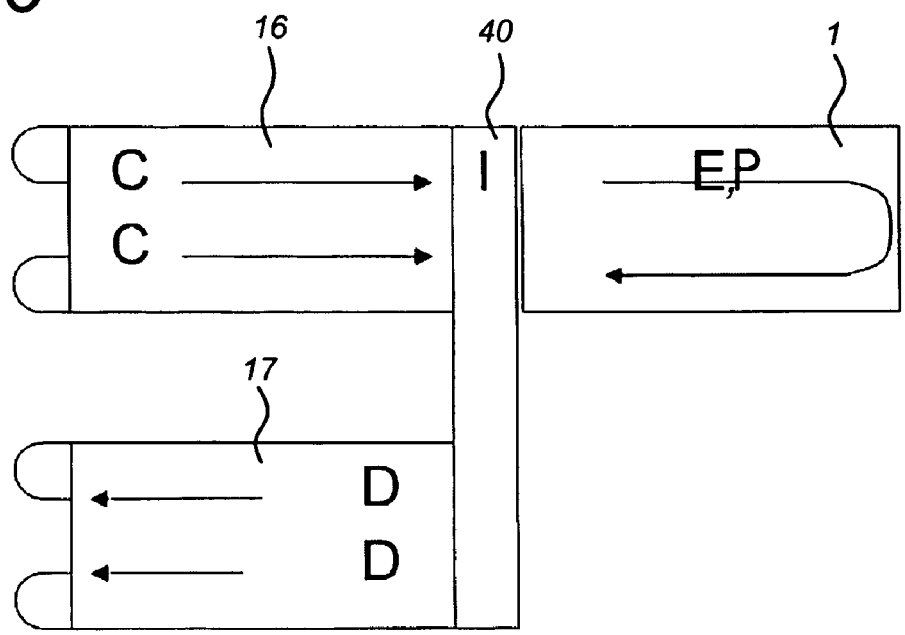
FIG. 6 shows a schematic view of a substrate processing facility according to an embodiment in which two different track modules are used.

An alternative embodiment is shown schematically in FIG. 6. Here, one processing module 16 is used which is only configured to execute the coating step 21, and one processing module 17 is used which is only configured to execute the developing step 24. In this embodiment, the substrate handling of the interface unit 40 is adapted to be able to receive substrates from the processing module 16, and to deliver substrates to the processing module 17. Again, the post-expose bake step 23 is part of the lithographic apparatus 1 (after the exposure), as discussed above.

It is noted that in the embodiments shown schematically in FIGS. 5 and 6, the processing modules 15, 16, 17 are shown with a space between the processing modules. This may also be the case in an actual arrangement of these embodiments, as such a space would allow to access each of the lithographic apparatus 1 and processing modules 2, 15-17 in a usual manner, e.g. for maintenance purposes.

Figure 7:
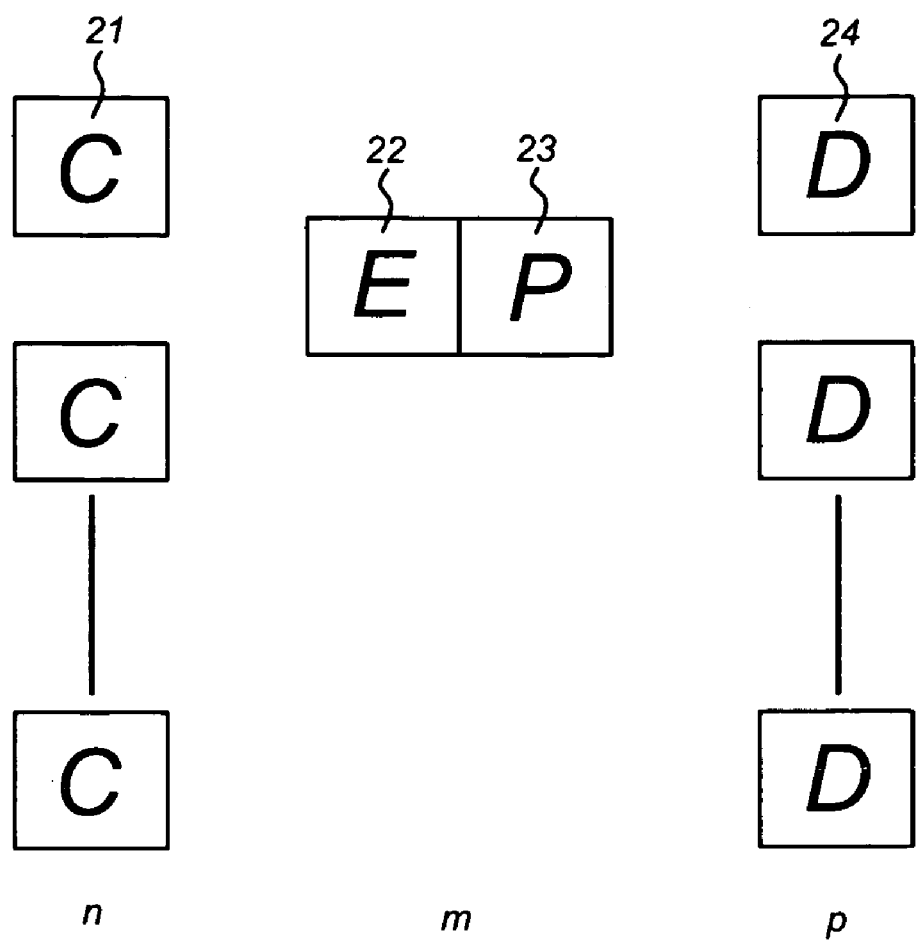
FIG. 7 shows a simplified schematic view of a generalized concept of a substrate processing facility according to an embodiment of the invention.

In the schematic view of FIG. 7, a generalized set-up of a substrate processing facility according to an embodiment of the invention is shown. In general, m lithographic apparatus 1, which perform the exposure step 22 and post-exposure bake step 23, may be combined with n processing modules 2 performing the coating step and p processing modules 2 performing the developing step 24, where some of the coating and developing steps may be combined in one processing module.

According to an embodiment of the invention, a lithographic apparatus is provided configured to transfer a pattern from a patterning device onto a substrate, comprising an integrated post-exposure bake device, the post-exposure bake device configured to subject the substrate to a predefined temperature cycle. By integrating a post-exposure bake step (the predefined temperature cycle) into the lithographic apparatus, it is possible to have this time critical step in the substrate processing under accurate control, resulting in improvements of the substrate processing, e.g. in terms of critical dimension stability. In particular, the post-exposure bake device may be further configured to subject the substrate to the predefined temperature cycle within a predetermined time period after the transfer of the pattern, such that accuracy and reliability may be achieved.

In a further embodiment, a combination of a lithographic apparatus configured to transfer a pattern from a patterning device onto a substrate, and a processing system is provided, wherein the lithographic apparatus comprises an integrated post-exposure bake device, the post-exposure bake device configured to subject the substrate to a predefined temperature cycle, and wherein the processing system comprises a substrate interface (e.g. a FOUP) configured to provide a substrate to the lithographic apparatus and to receive a substrate from the lithographic apparatus. Again, the post-exposure bake device may be further configured to subject the substrate to the predefined temperature cycle within a predetermined time period after the transfer of the pattern.

In another embodiment, the processing system further comprises a processing module configured to execute a subset of functions related to substrate processing, wherein the subset of functions comprises one or more of the group of: providing a coating to the substrate, soft bake before exposure, developing the substrate, buffer the substrate, or performing measurements on the substrate. Such a combination allows more flexibility, while still maintaining sufficient control and reliability of the time critical steps in the substrate processing.

In a further embodiment, the processing system further comprises at least two processing modules configured to execute a subset of functions related to substrate processing, wherein the subset of functions comprises one or more of the group of: providing a coating to the substrate, soft bake before exposure, developing the substrate, buffer the substrate, or performing measurements on the substrate.

In an embodiment, the lithographic apparatus and one or more of the at least two processing modules form a closed environment, allowing improved control of processing conditions, thus e.g. enabling contamination control.

In another embodiment, the combination may further comprise an interface unit configured to transfer substrates between the lithographic apparatus and the at least two processing modules, such as described with reference to FIG. 4 above.

In an embodiment, one of the at least two processing modules may comprise a coating module configured to receive a substrate, to coat the substrate, and to transfer the substrate to the interface unit. One of the at least two processing modules may comprise a developing module configured to receive a substrate from the interface unit, and to develop the substrate. One of the at least two processing modules may comprise a combination of a coating module and a developing module, the combination being configured to receive a substrate, to coat the substrate, to transfer the substrate to the interface unit, to receive a substrate from the interface unit, and to develop the substrate. These embodiments have been described in more detail above with reference to FIGS. 5 and 6. The at least two processing modules may have a combined throughput capacity which is larger than the throughput capacity of the lithographic apparatus, as also described with reference to the embodiment of FIG. 7 described above.

In a further aspect, there is provided a device manufacturing method comprising transferring a pattern from a patterning device onto a substrate, subjecting the substrate to a predefined temperature cycle after transferring of the pattern, pre-processing of the substrate before transferring the pattern, and post-processing of the substrate after transferring the pattern, wherein the transferring of the pattern and the subjecting of the substrate to a predefined temperature cycle of the substrate are executed within a lithographic apparatus, and the pre-processing and post-processing are executed independently from the transferring of the pattern and subjecting of the substrate to a predefined temperature cycle. The transferring of the pattern and the predefined temperature cycle (post-exposure bake) of the substrate may be executed within a predetermined time period from each other, to allow accurate control of these time critical functions and thus allow provision of a consistently processed substrate. The pre-processing may comprise providing a coating to the substrate and/or the post-processing may comprise one or more of developing the substrate, buffer the substrate, or performing measurements on the substrate. A pre-processing throughput capacity may be larger than the throughput capacity of the combination of the transferring of the pattern and the post-exposure bake of the substrate. Furthermore, a post-processing throughput capacity may be larger than the throughput capacity of the combination of the transferring of the pattern and the post-exposure bake of the substrate.

One or more embodiments of the invention may be used in combination with a reflective type of lithographic apparatus, e.g. using EUV radiation to expose a substrate to a patterned beam of radiation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus configured to transfer a pattern from a patterning device onto a substrate, comprising an integrated post-exposure bake device, the post-exposure bake device configured to subject the substrate to a predefined temperature cycle, wherein the lithographic apparatus is not configured to coat the substrate, or not configured to develop the substrate, or not configured to coat and develop the substrate.

2. The lithographic apparatus of claim 1, wherein the post-exposure bake device is further configured to subject the substrate to the predefined temperature cycle within a predetermined time period after the transfer of the pattern.

3. A combination of a lithographic apparatus configured to transfer a pattern from a patterning device onto a substrate and a processing system, wherein the lithographic apparatus comprises an integrated post-exposure bake device, the post-exposure bake device configured to subject the substrate to a predefined temperature cycle and the lithographic apparatus is not configured to coat the substrate, or not configured to develop the substrate, or not configured to coat and develop the substrate, and wherein the processing system comprises a substrate interface configured to provide a substrate to the lithographic apparatus and to receive a substrate from the lithographic apparatus.

4. The combination of claim 3, wherein the post-exposure bake device is further configured to subject the substrate to the predefined temperature cycle within a predetermined time period after the transfer of the pattern.

5. The combination of claim 3, wherein the processing system further comprises a processing module configured to execute a subset of functions related to substrate processing, wherein the subset of functions comprises one or more of the group of: providing a coating to the substrate, soft bake before exposure, developing the substrate, buffer the substrate, or performing measurements on the substrate.

6. The combination of claim 3, wherein the processing system further comprises at least two processing modules configured to execute a subset of functions related to substrate processing, wherein the subset of functions comprises one or more of the group of: providing a coating to the substrate, soft bake before exposure, developing the substrate, buffer the substrate, or performing measurements on the substrate.

7. The combination of claim 6, wherein the lithographic apparatus and one or more of the at least two processing modules form a closed environment.

8. The combination of claim 6, further comprising an interface unit configured to transfer substrates between the lithographic apparatus and the at least two processing modules.

9. The combination of claim 8, wherein one of the at least two processing modules comprises a coating module configured to receive a substrate, to coat the substrate, and to transfer the substrate to the interface unit.

10. The combination of claim 8, wherein one of the at least two processing modules comprises a developing module configured to receive a substrate from the interface unit, and to develop the substrate.

11. The combination of claim 8, wherein one of the at least two processing modules comprises a combination of a coating module and a developing module, the combination being configured to receive a substrate, to coat the substrate, to transfer the substrate to the interface unit, to receive a substrate from the interface unit, and to develop the substrate.

12. The combination of claim 8, wherein the at least two processing modules have a combined throughput capacity which is larger than the throughput capacity of the lithographic apparatus.

* * * * *

UNITED STATES PATENT AND TRADEMARK OFFICE
CERTIFICATE OF CORRECTION

| | | |
|---|---|---|
| PATENT NO. | : 7,679,714 B2 | Page 1 of 1 |
| APPLICATION NO. | : 11/546546 | |
| DATED | : March 16, 2010 | |
| INVENTOR(S) | : Onvlee et al. | |

It is certified that error appears in the above-identified patent and that said Letters Patent is hereby corrected as shown below:

Title Page

(75) Inventors: "David Christopher Christopher Ockwell, Waalre (NL)" should read

--David Christopher Ockwell, Waalre (NL)--

Signed and Sealed this

First Day of June, 2010

David J. Kappos
*Director of the United States Patent and Trademark Office*